US009467722B2

(12) United States Patent
Tapie et al.

(10) Patent No.: US 9,467,722 B2
(45) Date of Patent: Oct. 11, 2016

(54) SYSTEM FOR GENERATION OF A SYNCHRONIZATION SIGNAL VIA STATIONS CONNECTED VIA A PACKET SWITCHING NETWORK

(75) Inventors: Thierry Tapie, Rennes (FR); Serge Defrance, Rennes (FR); Philippe Rio, Rennes (FR)

(73) Assignee: Thomson Licensing, Issy-les-Moulineaux (FR)

( * ) Notice: Subject to any disclaimer, the term of this patent is extended or adjusted under 35 U.S.C. 154(b) by 524 days.

(21) Appl. No.: 12/460,996

(22) Filed: Jul. 28, 2009

(65) Prior Publication Data

US 2010/0042748 A1    Feb. 18, 2010

(30) Foreign Application Priority Data

Jul. 29, 2008 (FR) ...................................... 08 55218

(51) Int. Cl.
*G06F 15/16* (2006.01)
*H04N 21/242* (2011.01)
(Continued)

(52) U.S. Cl.
CPC .............. *H04N 21/242* (2013.01); *H03L 7/18* (2013.01); *H04N 21/2368* (2013.01); *H04N 21/4341* (2013.01); *H04N 21/8547* (2013.01); *H04J 3/0664* (2013.01)

(58) Field of Classification Search
USPC ......................................................... 709/248
See application file for complete search history.

(56) References Cited

U.S. PATENT DOCUMENTS 4,695,805 A * 9/1987 Massingill .............. H04L 7/033
327/156
5,555,024 A * 9/1996 Limberg ................ H04H 20/31
348/473
(Continued)

FOREIGN PATENT DOCUMENTS

CN       101183927        5/2008
EP        1471745        10/2004
(Continued)

OTHER PUBLICATIONS

French Search Report dated Mar. 26, 2009.
(Continued)

*Primary Examiner* — Brian P Whipple
*Assistant Examiner* — James Edwards
(74) *Attorney, Agent, or Firm* — Myers Wolin LLC

(57) ABSTRACT

The present invention relates to the domain of synchronization of items of equipment connected by a packet switching network. It relates more specifically to a system for generation of a synchronization signal (PIPA, PIPB) and a clock signal (CLK_outA, CLK_outB) by a slave station (SA, SB) connected to a master station (SM) via a packet switching network. The master station (SM) is conformed to produce a master clock signal (CLKM) of frequency $F_M$ and a master synchronization signal (PIPM). The master synchronization signal (PIPM) is in phase with the master clock signal (SM). The slave station (SA, SB) comprises the primary synthesis means (SM1A, SM1B) producing a slave periodic signal TICKSA, TICKSB), the periodic signal (TICKSA, TICKSB) is in phase with the master clock signal (CLKM). According to the invention, the slave station (SA, SB) also comprises the secondary means of synthesis (SM2A, SM2B) to synthesize a clock signal (CLK_outA, CLK_outB) and the synchronization signal (PIPA, PIPB) and in that said clock signal (CLK_outA, CLK_outB) and said synchronization signal (PIPA, PIPB) are in phase with said signal (TICKSA, TICKSB).

12 Claims, 3 Drawing Sheets

(51) Int. Cl.
*H03L 7/18* (2006.01)
*H04N 21/2368* (2011.01)
*H04N 21/434* (2011.01)
*H04N 21/8547* (2011.01)
*H04J 3/06* (2006.01)

(56) References Cited

U.S. PATENT DOCUMENTS

| | | | | |
|---|---|---|---|---|
| 6,119,213 | A * | 9/2000 | Robbins | H04N 21/4305 375/E7.094 |
| 6,184,938 | B1 * | 2/2001 | Patel | H04N 5/211 348/614 |
| 6,424,185 | B1 | 7/2002 | Wolf | |
| 7,382,151 | B1 * | 6/2008 | Truong | H04L 25/45 326/27 |
| 7,801,258 | B2 * | 9/2010 | Narus | G01R 31/31726 375/356 |
| 8,711,886 | B2 | 4/2014 | Tapie et al. | |
| 2002/0129374 | A1 * | 9/2002 | Freeman | H04H 20/12 725/91 |
| 2003/0156652 | A1 * | 8/2003 | Wise | G06F 9/3867 375/240.26 |
| 2003/0172179 | A1 | 9/2003 | Pavon et al. | |
| 2004/0207763 | A1 * | 10/2004 | Ciardi | H04N 9/45 348/723 |
| 2004/0233997 | A1 * | 11/2004 | Umesako | H04N 5/4401 375/240.26 |
| 2006/0119708 | A1 * | 6/2006 | Rotte | H04N 5/073 348/207.99 |
| 2006/0156375 | A1 * | 7/2006 | Konetski | H04N 5/76 725/135 |
| 2006/0269029 | A1 * | 11/2006 | Repko | H04J 3/0664 375/356 |
| 2006/0280182 | A1 * | 12/2006 | Williams | H04J 3/0632 370/394 |
| 2007/0127930 | A1 * | 6/2007 | Prodanov | G01R 31/31726 398/155 |
| 2007/0223464 | A1 | 9/2007 | Weir et al. | |
| 2008/0129870 | A1 | 6/2008 | Champion et al. | |
| 2009/0175271 | A1 | 7/2009 | Tapie et al. | |
| 2009/0231191 | A1 * | 9/2009 | Wu | G04G 7/00 342/357.395 |
| 2009/0276542 | A1 * | 11/2009 | Aweya | H04J 3/0667 709/248 |
| 2010/0135328 | A1 * | 6/2010 | Sasson | H04L 69/28 370/474 |
| 2010/0228881 | A1 * | 9/2010 | Williams | H04J 3/0632 709/248 |

FOREIGN PATENT DOCUMENTS

| | | |
|---|---|---|
| EP | 1947865 | 7/2008 |
| FR | 2898453 | 9/2007 |
| JP | 2007068055 | 3/2007 |
| WO | WO2007104891 | 9/2007 |

OTHER PUBLICATIONS

IEEE Standard 1588-2008, "IEEE Standard for a Precision Clock Synchronization Protocol for Networked Measurement and Control Systems", IEEE Instrumentation and Measurement Society Sponsored by the Technical Committee on Sensor Technology (TC-9), Jul. 24, 2008, pp. 1-289.

* cited by examiner

SYSTEM FOR GENERATION OF A SYNCHRONIZATION SIGNAL VIA STATIONS CONNECTED VIA A PACKET SWITCHING NETWORK

This application claims the benefit, under 35 U.S.C. §119 of European Patent Application No. 0855218, filed Jul. 29, 2008.

BACKGROUND OF THE INVENTION

1. Field of the Invention

The present invention relates to the domain of synchronization of items of equipment connected by a packet switching network. The present invention relates more specifically to a system for generation of a synchronization signal by stations connected by such a network, the synchronization signal being able to be used to synchronize remote items of equipment.

2. Description of the Prior Art

Progress in the ability of IP networks to transport all types of signal (data or video) has made it possible to use these networks as the "backbone" architecture for video studios. Of capital importance to this change is therefore having a single infrastructure for the transport of data. Whereas in the past, several media were necessary to transport different signal types between items of equipment, the multiplexing properties offered by the IP layer enable a reduction in the number of media necessary: an IP network that links the different items of equipment.

In the prior art, the synchronisation of items of video equipment (cameras, etc.) in a studio is carried out by the transmission of a synchronisation signal commonly called "Genlock" or "Black burst". For example, the Genlock signal includes information from the start of the image, repeated every 40 ms, and information from the start of the line repeated every 64 µs. The waveforms of synchronisation signals are a function of the format of the image transmitted on the network. For example, for a high definition image, the synchronisation signal has a tri-level form (−300 mV, 0V, +300 mV).

When a synchronisation signal is routed to different items of equipment to be synchronised by a dedicated coaxial cable, a constant transmission time, without jitter is ensured. From such a signal, all items of equipment are able to reconstruct a timing clock that is specific to its functioning, which guarantees that its functioning is rigorously in phase with all the equipment connected to the same network. For example, two cameras synchronised by a Genlock signal circulating on a dedicated coaxial cable each generate a video with different contents but rigorously in frequency and in phase with one another.

A known disadvantage presented by an IP/Ethernet network is that it introduces a strong jitter in a transmission of signals, and particularly for the transmission of a synchronisation signal. The transmission duration is on average constant but different for each packet transmitted. When such a signal is routed by an IP/Ethernet connection to different items of equipment for synchronising, this jitter results in fluctuations in the length of time required for the information carried by the synchronisation signal to reach the equipment.

In the prior art, for a set of devices, for example cameras, connected to an IP network, devices are known to reconstruct at the level of each camera, a timing clock specific to each camera enabling it to overcome jitter. The underlying principle of these synchronization devices is based on a high attenuation of the synchronisation signal jitter amplitude at the level of reception. In such a way, it can be guaranteed that an image generated by a camera connected to the network is rigorously in phase with all of the images generated by neighbouring cameras connected to the same network.

Examples of such synchronization devices are described in the international PCT application FR2007/050918, they act on program clock reference (PCR) signals that represent very accurate reference clock signals. These digital signals are sent to cameras across a network so that they can locally reconstruct clock signals that are in phase with the reference clock.

One purpose of the present invention is to propose an alternative to these synchronization devices of the prior art to generate on a slave station a synchronization signal and a clock signal in accordance with a master synchronization signal and a master clock signal produced by a master station without requiring a regular transmission of specific digital signals between the master station and the slave station.

SUMMARY OF THE INVENTION

The technical problem that the present invention proposes to resolve is to generate on at least one slave station connected to a master station via a packet switching network a synchronization signal and a clock signal identical to those produced by the master station, even though the master station does not regularly transmit specific digital signals to the slave station.

For this purpose, the present invention relates to a system for generation of a synchronization signal and a clock signal by a slave station connected to a master station via a packet switching network. The master station is conformed to produce a master clock signal frequency $F_M$ and a master synchronization signal. The master synchronization signal is in phase with the master clock signal. The slave station comprises the primary synthesis means producing a slave periodic signal, the periodic signal is in phase with the master clock signal.

A first advantage of the system according to the invention is that it enables the production of a synchronization signal and a clock signal on a slave station without requiring dedicated digital signal exchanges on the network between the master station and the slave station.

A second advantage of the invention is that it does not require equipping the master station with a specific dedicated digital data transmission device: only the slave stations comprise a specific arrangement which is more advantageous than the devices of the prior art in which the master station comprises a device to create a digital signal transmitted to the slave stations.

A third advantage of the invention is that, by construction, the synchronization signals and the clock signals produced by different stations have identical characteristics (precision, jitter).

BRIEF DESCRIPTION OF THE DRAWINGS

The invention will be better understood from the following description of an embodiment of the invention provided as an example by referring to the annexed figures, wherein.

DESCRIPTION OF THE PREFERRED EMBODIMENTS

As noted above, succeeding in producing on the slave stations SA and SB synchronization signals PIPA, PIPB and the clock signals CLK_outA and CLK_out B that have exactly the same frequency and that are perfectly in phase is a problem of interest in a great number of activity domains among which are counted notably the synchronization of items of video equipment for the production of video contents.

Figure 1:
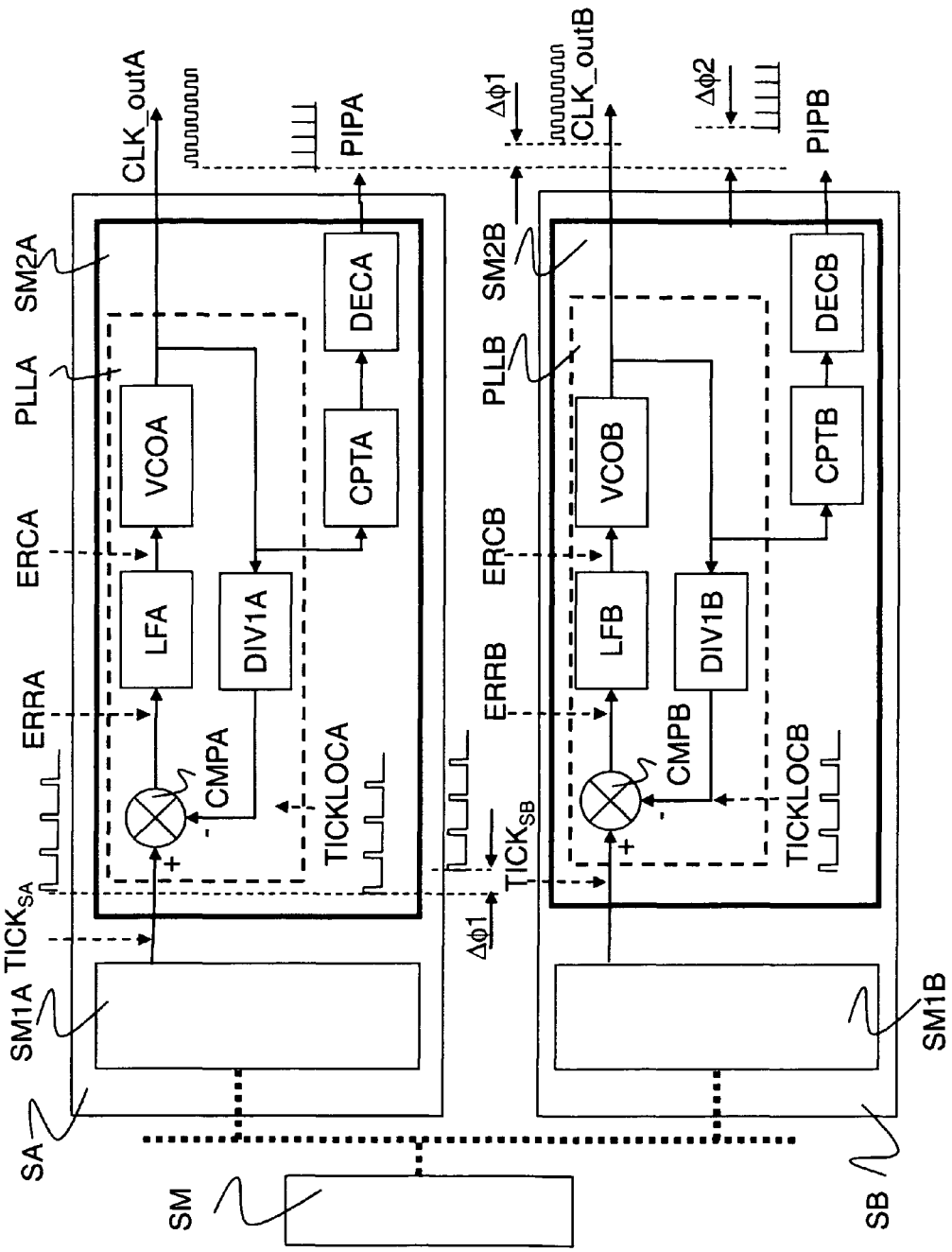
FIG. 1 shows an architecture of a device enabling synchronization signals of the same frequency on slave stations to be produced.

FIG. 1 shows three stations, one master station SM, and two slave stations SA, SB, that are connected by a packet switching network. The slave stations SA, SB are for example connected to cameras of a production studio, not represented. In this case, the synchronization signals PIPA, PIPB and the clock signals CLK_outA, CLK_outB serve to synchronize the studio cameras to notably facilitate the transitions between the images produced by each of the cameras.

The network is represented here by a thick dotted line.

Messages transmitted by a synchronization layer are exchanged between the master station SM and the slave stations SA, SB. In the case where the synchronization layer is IEEE 1588, the stations implementing this synchronization layer each comprise two 1588 counters, a first counter called the "second counter" and a second counter called the "nanosecond counter". These stations will observe changes in the values of these counters at the same time, at a close precision dependent on the implementation.

On a master station, the master synchronization signal PIPM is a periodic signal obtained from a decoding, by observation of the first and second counter (in the case where the synchronization layer is IEEE 1588). Any station implementing the same synchronization layer is capable of generating a synchronization signal.

The master station SM is conformed to produce a master clock signal CLKM of frequency $F_M$ and a master synchronization signal PIPM from the network layer, such as for example IEEE 1588. The master synchronization signal PIPM is in phase with the master clock signal CLKM.

The slave stations SA, SB comprise the primary means of synthesis SM1A, SM1B that produce a slave periodic signal TICKSA, TICKSB. The periodic signal TICKSA, TICKSB is in phase with the master clock signal CLKM. When the primary synthesis means SM1A, SMIB are identical, the periodic signals TICKSA, TICKSB have an identical frequency. But a phase difference $\Delta\phi 1$, a priori that can not be controlled, separates the periodic signals TICKSA, TICKSB produced on the different slave stations SA, SB.

The slave station SA, SB also comprises the secondary means of synthesis SM2A, SM2B to synthesize the clock signal CLK_outA, CLK_outB and the synchronization signal PIPA, PIPB from the periodic signal TICKSA, TICKSB that it receives.

The secondary means of synthesis SM2A, SM2B synthesizing a clock signal CLK_outA, CLK_outB and a synchronization signal PIPA, PIPB that are in phase with the periodic signal TICKSA, TICKSB that they receive.

The functioning of the secondary synthesis means SM2A, SM2B is detailed below:

The secondary synthesis means SM2A, SM2B comprise a phase-locked Loop PLLA, PLLB, a counter CPTA, CPTB and a decoder DECA, DECB.

The loop PLLA, PLLB receives the periodic signal TICKSA, TICKSB and produces the clock signal CLK_outA, CLK_outB. The signal TICKSA, TICKSB is in phase with the clock signal CLK_outA, CLK_outB.

The counter CPTA, CPTB receives the clock signal CLK_outA, CLK_outB and delivers a counting signal according to a range value that is selected according to the video standard of the items of equipment to be synchronized. For example the range value of the counter corresponds to a duration equal to 270000.40 milliseconds for the European video standard SD. The decoder DECA, DECB receives the counting signal and delivers the synchronization signal PIPA, PIPB.

The phase-locked Loop PLLA, PLLB comprises the means of comparison CMPA, CMPB, a filter LFA, LFB, a configurable oscillator VCOA, VCOB and a first stage frequency divider DIV1A, DIV1B.

The configurable oscillator VCOA, VCOB produces a periodic signal CLK_outA, CLK_outB of frequency F. The first stage frequency divider DIV1A, DIV1B receives the periodic signal CLK_outA, CLK_outB and produces a local periodic signal TICKLOCA, TICKLOCB of frequency F/q where q is an integer.

The means of comparison CMPA, CMPB compare the local periodic signal TICKLOCA, TICKLOCB and the periodic signal TICKSA, TICKSB. The means of comparison CMPA, CMPB producing a comparison result ERRA, ERRB, that is filtered by the filter LFA, LFB and that delivers a filtered result ERCA, ERCB. The configurable oscillator VCOA, VCOB receives the filtered result ERCA, ERCB.

Hence the phase difference $\Delta\phi 1$ observed between the periodic signals TICKSA, TICKSB is propagated: it is also observed between the clock signals CLK_outA, CLK_outB. Moreover, a phase difference $\Delta\phi 2$ is observed between the synchronization signals PIPA, PIPB. The difference $\Delta\phi 1$ and the phase difference $\Delta\phi 1$ are a priori different. The system presented in FIG. 1 does not therefore resolve the problem posed.

Figure 2:
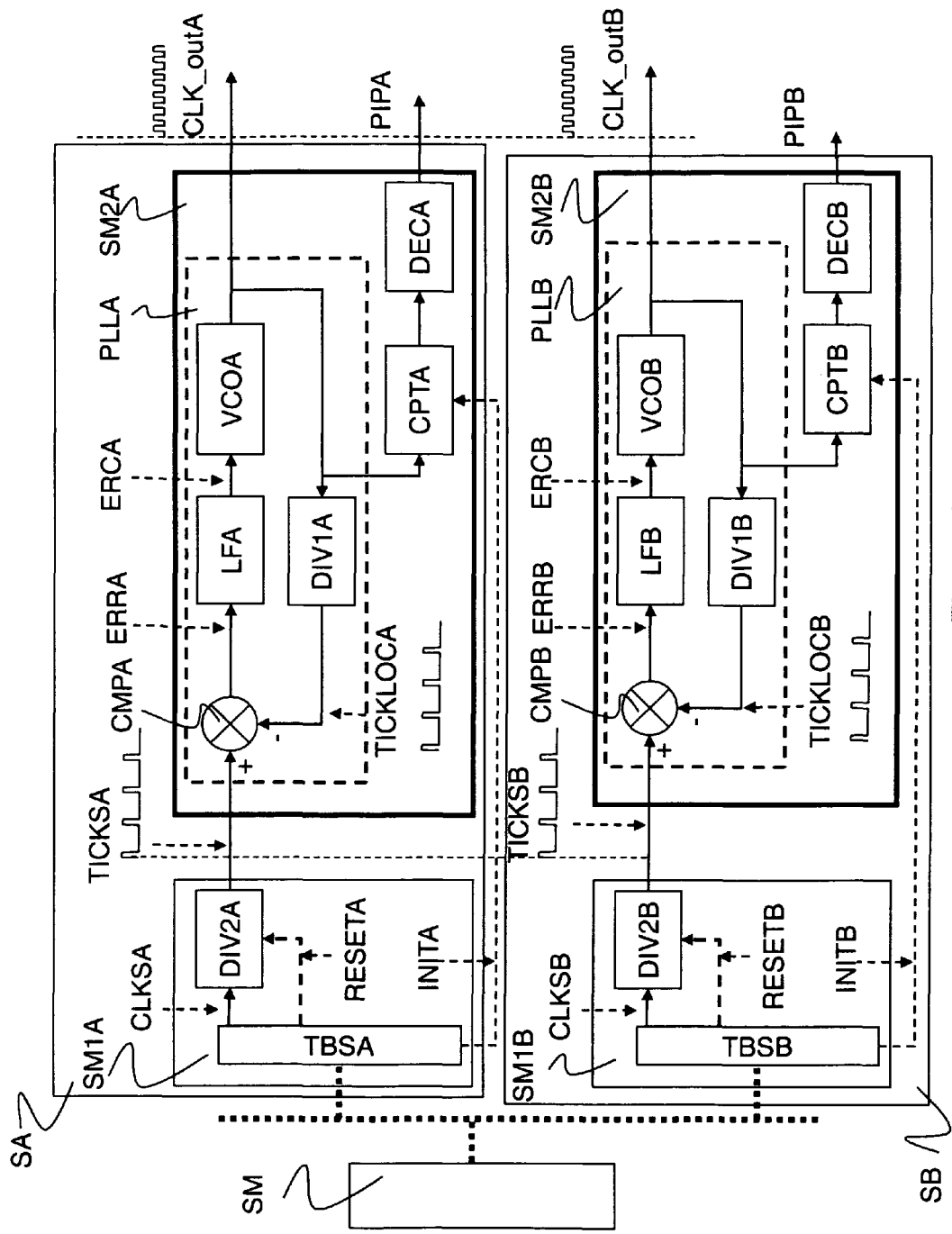
FIG. 2 shows an architecture of a first embodiment of a system for generation of a synchronization signal according to the invention.

FIG. 2 presents the architecture of slave stations SA, SB conformed so that the clock signal CLK_outA, CLK_outB and the synchronization signal PIPA, PIPB are in phase with the second signal TICKSA, TICKSB. This architecture represents a first embodiment of the invention.

The first means of synthesis SM1A, SM1B comprising the means TBSA, TBSB to generate a slave clock signal CLKSA, CLKSB identical to the master clock signal CLKM and a second frequency division stage DIV2A, DIV2B.

Advantageously, the primary means of synthesis SM1A, SM1B comprising a second frequency division stage DIV2A, DIV2B that receive the slave clock signal CLKSA, CLKSB and produce the periodic signal TICKSA, TICKSB of frequency $F_M/p$ where p is an integer, and in that said second stage DIV2A, DIV2B is initialized by an initialization signal RESETA, RESETB.

The slave clock signal CLKSA, CLKSB at a frequency a priori without relation to a frequency useful for the synchronization of an item of equipment. If the example in which the item of equipment to be synchronized is a camera, is considered, a useful frequency is 27 MHz.

Let for example a situation in which the frequency $F_M$ of the slave clock signal CLKSA, CLKSB is equal to 100 MHz be considered. A parameter value p equal to 100 is selected so that the frequency of the periodic signals TICKSA, TICKSB is equal to 1 MHz. The configurable oscillator VCOA, VCOB has here the role of creating a clock signal CLK_outA, CLK_out B of a frequency equal to 27 MHz. A parameter value q equal to 27 is selected so that the frequency of the periodic signal TICKLOCA, TICKLOCA is equal to that of the periodic signal TICKA, TICKB, that is to say a 1 MHz in this case.

The second stage DIV2A, DIV2B receives the slave clock signal CLKSA, CLKSB and produces the periodic signal TICKSA, TICKSB.

When a slave clock signal, for example CLKSA is delivered at two different second stages DIV2A, DIV2B, the periodic signals TICKSA, TICKSB produced by these two stages DIV2A, DIV2B are perfectly in phase.

But when two independent slave clock signals CLKSA, CLKSB each supply the two stages, a phase difference $\Delta\phi 1$ is observed between the second periodic signals TICKSA, TICKSB produced by the two second stages DIV2A, DIV2B. This phase difference $\Delta\phi 1$ is cancelled when an initialization signal RESETA, RESETB, identical on all the slave stations SA, SB initializes the second stage DIV2A, DIV2B.

Advantageously, the means for generation TBSA, TBSB based on a synchronization layer that periodically provides to the network a value of a first counter and a value of a second counter to produce the slave periodic signal TICKSA, TICKSB and the slave clock signal CLKSA, CLKSB.

The initialization signal RESETA, RESETB can be for example created from the temporal representation of the synchronization layer. In the case where this is IEEE 1588, it is possible to produce the initialization signal RESETA, RESETB on all the stations SA, SB, from information provided by the synchronization layer. For example by triggering pulses of the initialization signals RESETA, RESETB at predefined times such as when the second counter takes the value 0XABDEDEF and that simultaneously the nanosecond counter takes the value 0X000000. At all of the instants where this double condition is fulfilled the two stages DIV2A, DIV2B are all reset to zero simultaneously. The initialization signal RESETA, RESETB has in this case a period equal to one second. This method has the advantage of putting in phase the clock signals CLK_outA, CLK_outB used here to control the cameras and more generally the items of video equipment with the clock signals CLKSA, CLKSB, CLKM associated with the synchronization layer.

Advantageously, the initialization signal RESETA, RESETB is delivered by the primary means of synthesis SM1A, SM1B.

When the phase difference $\Delta\phi 1$ is null, the clock signals CLK_outA, CLK_outB produced by the second means of synthesis SM2A2, SM2B are perfectly in phase with the periodic signals TICKSA, TICKSB at every microsecond.

Moreover, when the phase difference $\Delta\phi 1$ between the clock signals CLK_outA and CLK_outB is null, a phase difference $\Delta\phi 2$ is observed between the synchronization signals PIPA and PIPB produced by two different slave stations SA, SB. This phase difference $\Delta\phi 2$ is cancelled when an initialization signal INITA, INITB identical on all the slave stations SA, SB initializes the second counter CPTA, CPTB.

Advantageously, the counter CPTA, CPTB is initialized by an initialization signal INITA, INITB in phase with the periodic signal TICKSA, TICKSB.

The initialization signal INITA, INITB can be produced in the same way as the initialization signal RESETA, RESETB from a temporal representation of the synchronization layer. For example at each detection of a passage through zero of the nanosecond counter. This method has the advantage of putting in phase the synchronization signals PIPA, PIPB used here to control the cameras and more generally the items of video equipment with the clock signals CLKSA, CLKSB, associated with the synchronization layer.

Advantageously, the initialization signal INITA, INITB is delivered by the primary means of synthesis SM1A, SM1B.

Advantageously, the initialization signal INITA, INITB and the signal RESETA, RESETB are in phase.

FIG. 2 shows an alternative architecture of slave stations SA, SB corresponding to a second embodiment of the invention.

This embodiment is simpler than the preceding one as it does not require a second stage frequency divider DIV2A, DIV2B.

The phase-locked Loop PLLA, PLLB uses a synchronization signal produced directly from the synchronization layer, for example IEEE 1588. The synchronization layer provides on all the slave stations SA, SB synchronization signals TICKSA, TICKSB that are synchronous with the clock of the synchronization layer. For example the synchronization signal TICKSA, TICKSB has a period equal to one second and is determined for example by a passage of second and nanosecond counters through predefined values. Remaining with this example, a parameter value q equal to 27000 is selected so that the frequency of the periodic signals TICKLOCA, TICKLOCB is equal to that of the periodic signals TICKA, TICKB, that is to say a 1 Hz in this case.

Figure 3:
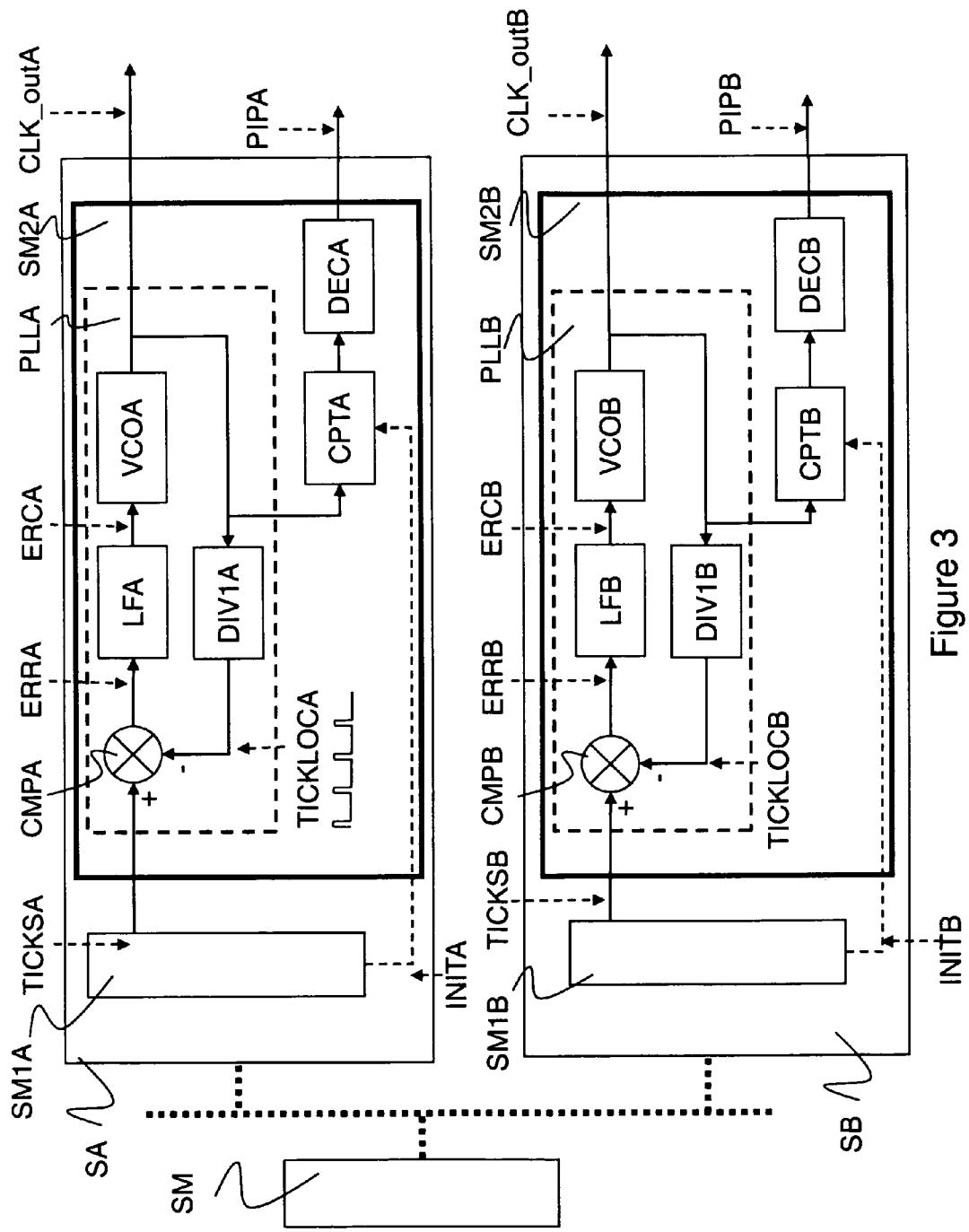
FIG. 3 shows an architecture of a second embodiment of a system for generation of a synchronization signal according to the invention.

FIG. 3 shows an alternative architecture of slave stations SA, SB corresponding to a third embodiment of the invention. This third embodiment is even simpler to implement than the two embodiments presented above as it does not require an initialization signal exterior to the secondary means of synthesis SM2A, SM2B.

In fact, the third embodiment of the invention consists in using the local periodic signal TICKLOCA, TICKLOCB as initialization signal INITA, INITB. This solution enables to initialize together the counter CPTA, CPTB regularly.

Advantageously, the initialization signal (INITA, INITB) is the local periodic signal TICKLOCA, TICKLOCB.

Advantageously, the master synchronization signal PIPM and the slave periodic signal TICKSA, TICKSB are produced from the value of the first counter.

Advantageously, the master clock signal (CLKM) and the slave clock signal CLKSA, CLKSB are produced from the value of the second counter.

Advantageously, the synchronization layer is IEEE 1588.

The invention is described in the preceding text as an example. It is understood that those skilled in the art are capable of producing variants of the invention without leaving the scope of the patent.

The invention claimed is:

1. A slave station apparatus comprising:
a phase-locked loop comprising a filter, a configurable oscillator; and a first stage frequency divider;
a second stage frequency divider;
a counter; and
circuitry configured to:
detect a master clock signal of frequency $F_M$ and a master synchronization signal received from a packet switching network, wherein said master synchronization signal is in phase with the master clock signal;

produce, using the second stage frequency divider, a slave periodic signal, wherein said slave periodic signal is in phase with the master clock signal and the slave periodic signal is of frequency $F_M/p$ where p is an integer;

generate a slave clock signal identical to the master clock signal;

detect the slave clock signal produced by the second stage frequency divider; detect, using the phase-locked loop, the slave periodic signal;

generate, using the configurable oscillator, a clock signal having a frequency F that is in phase with the slave periodic signal detect, using the first stage frequency divider, the clock signal having the frequency F that is in phase with the slave periodic signal;

produce, using the first stage frequency divider, a local periodic signal of frequency F/q where q is an integer;

detect, using the counter, the clock signal having the frequency F that is in phase with the slave periodic signal;

send, via a decoder, a video synchronization signal;

initialize, using the counter, the video synchronization signal based at least partially on a first stage initialization signal in phase with the slave periodic signal;

compare the local periodic signal and the slave periodic signal using the phase locked loop so as to produce a comparison result;

detect the comparison result with the filter; and generate, using the filter, a filtered result and send the filtered result to the configurable oscillator, the first stage initialization signal being the local periodic signal.

2. The slave station apparatus according to claim 1, wherein said second stage divider is initialized by a stage initialization signal.

3. The slave station apparatus according to claim 2, wherein the circuitry is configured to generate the slave clock signal based at least partially on a value of a first counter and a value of a second counter from which the slave periodic signal and the slave clock signal are based, the value of the first counter and the value of the second counter being received from the network.

4. The slave station apparatus according to claim 3, wherein the master synchronization signal and the slave periodic signal are produced from the value of the first counter.

5. The slave station apparatus according to claim 3, wherein the master clock signal and the slave clock signal are produced from the value of the second counter.

6. The slave station apparatus according to claim 1, wherein the video synchronization signal is a Genlock signal.

7. A method comprising:

detecting a master clock signal of frequency $F_M$ and a master synchronization signal received from a packet switching network, wherein said master synchronization signal is in phase with the master clock signal;

producing, using a second stage frequency divider, a slave periodic signal, wherein said slave periodic signal is in phase with the master clock signal and the slave periodic signal is of frequency $F_M/p$ where p is an integer;

generating a slave clock signal identical to the master clock signal;

detecting the slave clock signal produced by the second stage frequency divider;

detecting, using a phase-locked loop, the slave periodic signal;

generating, using a configurable oscillator in the phase-locked loop a clock signal having a frequency F that is in phase with the slave periodic signal;

detecting, using a first stage frequency divider, the clock signal having the frequency F that is in phase with the slave periodic signal;

producing, using the first stage frequency divider, a local periodic signal of frequency F/q where q is an integer;

detecting, using a counter, the clock signal having the frequency F that is in phase with the slave periodic signal;

send, via a decoder, a video synchronization signal;

initializing, using the counter, the video synchronization signal based at least partially on a first stage initialization signal in phase with the slave periodic signal;

comparing the local periodic signal and the slave periodic signal using the phase locked loop so as to produce a comparison result;

detecting the comparison result with a filter of the phase-locked loop;

generating, using the filter, a filtered result; and sending, by the filter, the filtered result to the configurable oscillator, the first stage initialization signal being the local periodic signal.

8. The method according to claim 7, further comprising initializing the second stage frequency divider with a stage initialization signal.

9. The method according to claim 8, further comprising:

generating the slave clock signal based at least partially on a value of a first counter and a value of a second counter from which the slave periodic signal and the slave clock signal are based, the value of the first counter and the value of the second counter being received from the network.

10. The method according to claim 9, further comprising producing the master synchronization signal and the slave periodic signal from the value of the first counter.

11. The method according to claim 9, further comprising producing the master clock signal and the slave clock signal from the value of the second counter.

12. The method according to claim 7, wherein the video synchronization signal is a Genlock signal.

* * * * *